(12) United States Patent
Callahan, Jr.

(10) Patent No.: US 6,747,515 B2
(45) Date of Patent: Jun. 8, 2004

(54) CIRCUIT FOR AUTOMATIC REGULATION OF A DIFFERENTIAL AMPLIFIER'S GAIN

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/963,023

(22) Filed: Sep. 25, 2001

(65) Prior Publication Data

US 2002/0008581 A1 Jan. 24, 2002

Related U.S. Application Data

(62) Division of application No. 09/561,093, filed on Apr. 28, 2000, now Pat. No. 6,297,698.

(51) Int. Cl.[7] .................................................. H03F 3/45
(52) U.S. Cl. ......................... 330/254; 330/138; 327/77
(58) Field of Search ................................. 330/254, 138, 330/140; 327/77, 88, 89, 560

(56) References Cited

U.S. PATENT DOCUMENTS 5,521,771 A * 5/1996 Keithley et al. ............ 360/75
5,805,022 A * 9/1998 Bruccoleri et al. ......... 330/254
5,907,261 A * 5/1999 Jones ......................... 330/254
6,151,150 A * 11/2000 Kikuchi ...................... 359/194

* cited by examiner

Primary Examiner—Henry Choe
(74) Attorney, Agent, or Firm—Lisa K. Jorgenson; Renee M. Larson

(57) ABSTRACT

A circuit for regulating the gain of a variable differential gain amplifier. In one embodiment, a fully differential amplifier amplifies the outputs of the variable gain amplifier. The outputs of the fully differential amplifier are applied to a three input comparator so that if either of the outputs are greater than a reference voltage, a control signal is generated which is used to regulate the gain of the variable gain amplifier. In other embodiments, an analog OR function is used as an input to a conventional two input comparator in place of the three input comparator. In another embodiment, outputs of the variable gain amplifier are passed through switches to a scaling circuit which either voltage divides or amplifies and combines the outputs before application to a comparator. In each case, known asymmetries can be compensated for by independent gain control of each of the outputs of the variable gain differential amplifier.

27 Claims, 2 Drawing Sheets

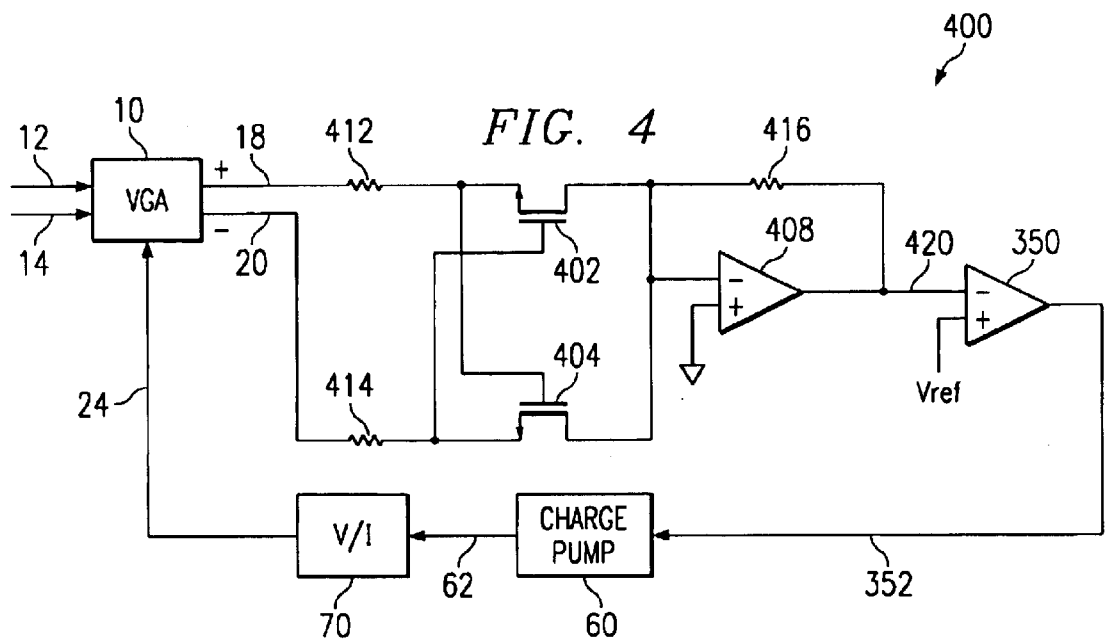
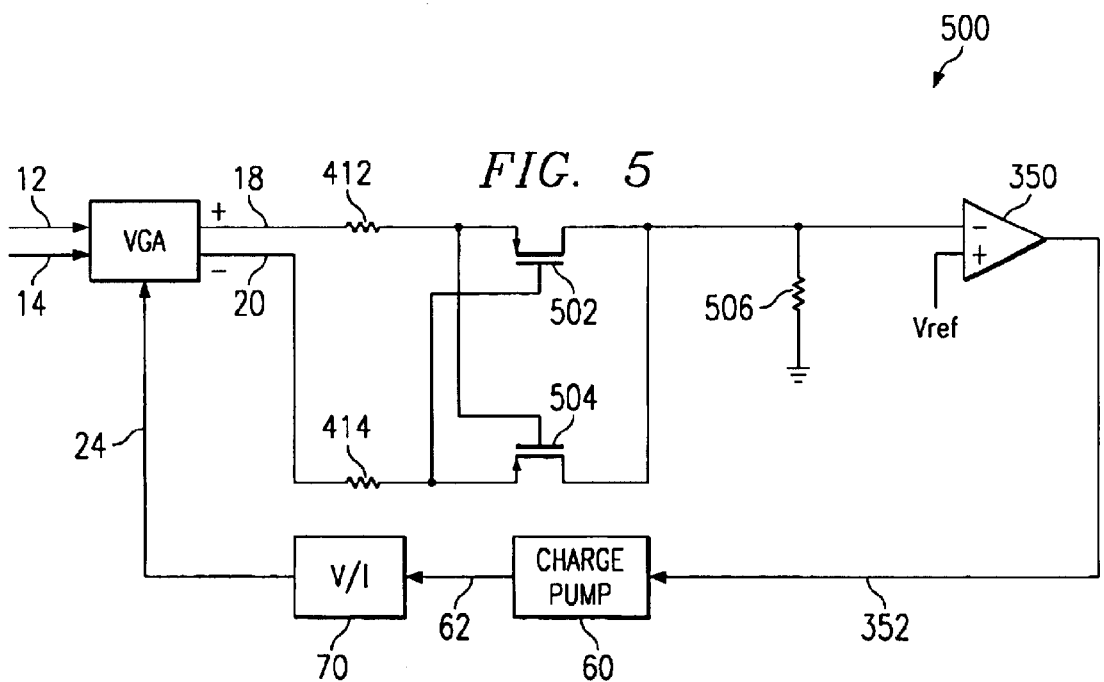

CIRCUIT FOR AUTOMATIC REGULATION OF A DIFFERENTIAL AMPLIFIER'S GAIN

This application is a division of application Ser. No. 09/561,093, filed Apr. 28, 2000, now U.S. Pat. No. 6,297,698.

CROSS REFERENCE TO RELATED DOCUMENTS

U.S. Pat. No. 5,805,022 to Bruccoleri et al. and U.S. Pat. No. 5,349,304 to Ryat are hereby incorporated by reference.

TECHNICAL FIELD

This invention relates generally to the field of integrated circuits for automatically regulating the gain of a differential amplifier.

BACKGROUND OF THE INVENTION

In many applications it is desirable to amplify a signal of variable amplitude in a manner such that the level of the amplified signal is substantially constant. For this purpose, amplifiers with variable gains which are regulated according to a feedback mechanism are often used.

In U.S. Pat. No. 5,805,022 to Bruccoleri et al., a circuit is described in which the output of a variable gain differential amplifier drives a full-wave rectifier. The full wave rectifier output signals are used to drive a comparator. This comparator in turn drives a charge pump circuit whose output is converted from voltage-to-current to serve as a regulating signal for controlling the gain of the variable gain differential amplifier (VGA). When this circuit operates on an amplified input signal that is asymmetrical, Bruccoleri et al indicate that it has a disadvantage. Bruccoleri et al indicate that the portion of the asymmetrical signal emerging from the full wave rectifier with the greatest amplitude exclusively controls the gain of the VGA, which can be problematic in some instances.

In order to remedy this perceived shortcoming, Bruccoleri et al provide a gain-regulating circuit which substitutes two half-wave rectifiers for the full wave rectifier. Moreover, each half-wave rectified signal is supplied to its own comparator and charge-pump circuit. The result is a circuit that independently integrates the contribution of the output of each half-wave rectifier to establish an appropriate level of gain for the VGA.

Unfortunately, although this circuit operates well with both symmetrical and asymmetrical signals, the duplication of current sources, comparators and charge pumps required to implement this arrangement uses a large amount of silicon on a semiconductor device. This results in increased cost, size and power consumption and decreased reliability.

While the circuit arrangement of Bruccoleri et al. provides good performance, there is need for other circuit variations that can be used to reduce the amount of silicon consumed on a semiconductor device, for use when amplifying both symmetrical and non-symmetrical signals.

BRIEF SUMMARY OF THE INVENTION

In accordance with one embodiment of the present invention, a circuit which regulates gain in a differential amplifier having first and second outputs, includes a fully differential amplifier receiving the first and second outputs, the fully differential amplifier producing first and second amplified outputs. A comparison circuit compares the first and second amplified outputs with a reference and produces an output signal if either the first or second amplified output exceeds the reference. A processing circuit is connected to receive the output signal from the comparison circuit, and to generate a regulating signal dependent upon a duration of the output signal, wherein the regulating signal regulates a gain of the differential amplifier.

In another embodiment of the present invention, a circuit which regulates gain in a differential amplifier having first and second outputs includes a first switch coupled to the first output, the first switch being controlled by the second output. A second switch is coupled to the second output, the second switch being controlled by the first output. A scaling circuit receives the first and second outputs under control of the first and second switches to produce a scaled output. A comparison circuit compares the scaled output with a reference and produces an output signal if the scaled output exceeds the reference. A processing circuit, connected to receive the output signal from the comparison circuit, generates a regulating signal dependent upon a duration of the output signal wherein the regulating signal regulates the gain of the differential amplifier.

In yet another embodiment of the present invention, a circuit which regulates gain in a differential-amplifier having first and second outputs includes a fully differential amplifier receiving the first and second outputs, the fully differential amplifier having a first gain applied to the first output and a second gain applied to the second output to produce first and second amplified outputs. A comparison circuit compares the amplified first and second amplified outputs with a reference and produces an output signal if either the first or second amplified output exceeds the reference. The comparison circuit includes: a comparator having multiple inputs each of which are compared with a reference, and a processing circuit, connected to receive the output signal from the comparison circuit. The processing circuit generates a regulating signal dependent upon a duration of the output signal. The processing circuit includes: a charge pump receiving the output signal from the comparison circuit and producing a control voltage, and a voltage to current converter receiving the control voltage from the charge pump and producing a control current therefrom. The control current operates as a regulating signal that regulates the gain of the differential amplifier.

A method of regulating a gain of a variable gain differential amplifier having output signals, according to an embodiment of the invention includes: amplifying the output signals to produce amplified signals; comparing the amplified signals with a reference in a comparison circuit; and if either amplified signal exceeds the threshold, generating a regulating signal to reduce the gain of the variable gain amplifier.

Another method of detecting a level of a differential output signal in accordance with one embodiment of the present invention includes: comparing each differential output signal with a reference signal using a single comparison circuit; and if either output signal exceeds the reference signal, generating an output signal.

Many variations, equivalents and permutations of these illustrative exemplary embodiments of the invention will occur to those skilled in the art upon consideration of the description that follows. The particular exemplary embodiments described above should not be considered to limit the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 4 is a schematic diagram of a gain regulating circuit in accordance with a third embodiment of the present invention.

FIG. 5 is a schematic diagram of a gain regulating circuit in accordance with a fourth embodiment of the present invention.

DETAILED DESCRIPTION OF THE INVENTION

Figure 1:
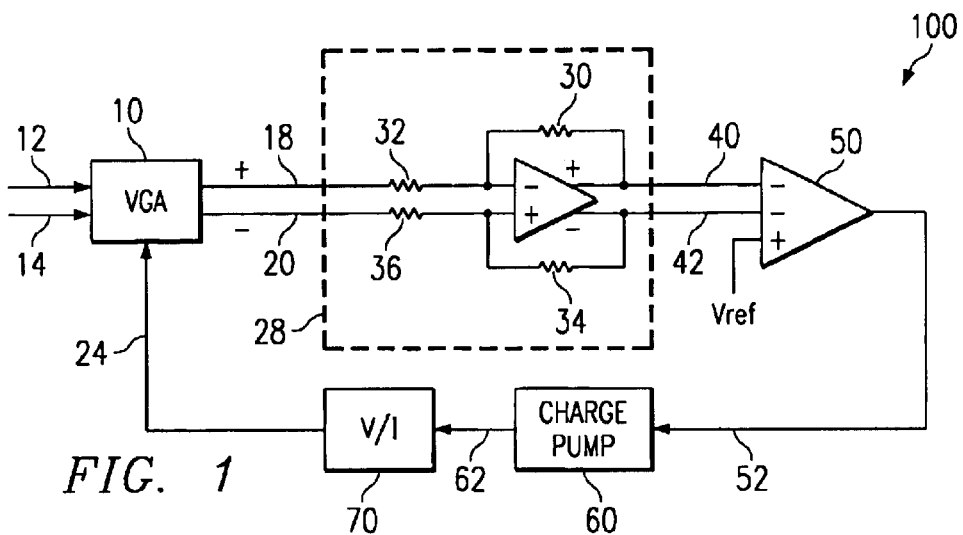
FIG. 1 is a schematic diagram of a gain regulating circuit in accordance with a first embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Referring now to FIG. 1, a first embodiment of a gain-regulating circuit for a differential amplifier in accordance with the present invention is illustrated as 100. In this embodiment, a variable gain differential amplifier (VGA) 10 receives differential input signals 12 and 14 to produce differential outputs at output terminals 18 and 20, with terminal 18 providing a non-inverting output and terminal 20 providing an inverting output. A regulating signal 24 provided by voltage-to-current converter 70 is applied to the VGA 10 to control the gain thereof. VGA 10 may operate in a manner similar to that of U.S. Pat. No. 5,805,022.

The differential output signals appearing at terminals 18 and 20 of VGA 10 are applied to a fully differential amplifier 28. Amplifier 28 provides an amount of gain determined by resistors 30, 32, 34 and 36. Fully differential amplifier 28 generates a pair of outputs 40 and 42, which are applied to inverting inputs of a three input comparator 50. In the amplifier configuration of fully differential amplifier 28 as illustrated, the gain from output 18 of VGA 10 to output 40 of the fully differential amplifier 28 can be approximated by the ratio of resistor 30 to resistor 32 and the output 40 produced is inverted by 180°. Similarly, the signal at node 20 of VGA 10 is amplified to produce a signal at output 42 of fully differential amplifier 28 by a gain factor that can be approximated by the ratio of resistor 34 to resistor 36. Again, the value of the output 42 is shifted with reference to the input 20 by 180°. The common-mode output voltage is adjusted to a predetermined level in known ways. However, for the situation where the gains through the two different signal paths are intentionally different, an adjustment to the normal common-mode circuit is needed. This adjustment may be done by summing the two different output voltages in a manner inversely proportional to the gains in each path.

The signals at outputs 40 and 42 are applied to two inverting inputs of three input comparator 50 and are compared with a reference signal $V_{REF}$ at the non-inverting input of comparator 50 to produce an output signal at the comparator output 52 whenever one of the signals at either of the inverting inputs exceeds the $V_{REF}$ threshold at the non-inverting input of comparator 50. In other embodiments, three input comparator 50 could be provided to have two non-inverting inputs and one inverting input which is used to establish the $V_{REF}$ for comparison in the comparator. Such a comparator is illustrated in U.S. Pat. No. 5,349,304 to Ryat. In this alternative, the sense of the logic output at output 52 may be inverted.

It should be noted at this point that the input signals at the inverting comparator inputs of comparator 50 are still differential signals. Therefore, with reference to a common mode signal, the values at 40 and 42 of the signal will always have an inverse relationship. Therefore, assuming a common mode signal of zero volts, for example, if there is a voltage of 1V at node 40 there will be a voltage of −1V at 42 if the signal is symmetrical and amplifier 28 is configured with resistor values which produce equal gain for the two input signals supplied from nodes 18 and 20. However, this example is not intended to be limiting since the gains may be purposely set at different values or made adjustable to compensate for a known asymmetry in the signal at the output of VGA 10.

The three input comparator 50 may be constructed in a manner similar to another embodiment, the circuit configuration of FIG. 2 may be used, as will be discussed later. The output 52 of comparator 50 is applied to a charge-pump circuit 60 which produces an output signal in the form of a control voltage at output 62. The control voltage at output 62 is applied to a voltage-to-current converter 70 which converts the voltage at 62 to a current regulating signal 24 suitable for controlling the gain of VGA 10. Charge pump 60 and voltage-to-current converter 70 as well as VGA 10 may be of similar design to those corresponding circuit elements disclosed in U.S. Pat. No. 5,805,022 to Bruccoleri et al.

Circuit 100 can account for known asymmetrical signals by using asymmetrical gains in fully differential amplifier 28. Moreover, since only one three-input comparator is needed, along with one charge pump and one current-to-voltage converter, this implementation of a gain regulating circuit substantially reduces the amount of silicon real estate required for implementation as compared with the duplicate circuits described in the Bruccoleri et al patent.

Figure 2:
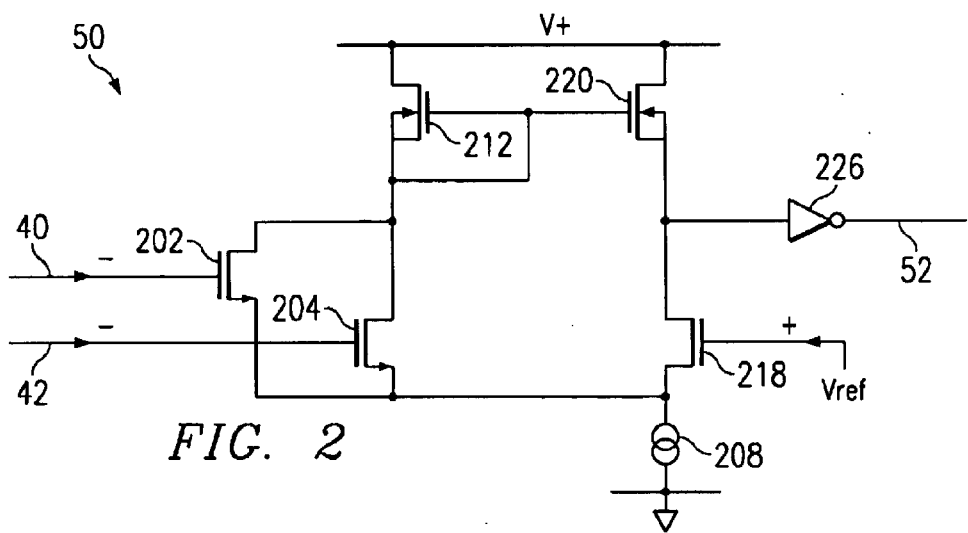
FIG. 2 is a schematic diagram of a three input comparator as used in the embodiment of FIG. 1.

Referring now to FIG. 2, one implementation of three input comparator 50 is illustrated. Recall that the differential nature of the signals applied to the input of comparator 50 defines that whenever there is an input to the VGA, the inverting inputs are by definition at differing voltage levels. Only at near crossings of the common mode voltage level will the two signals at 40 and 42 approximate one another. Thus, a very simple implementation using a minimal number of transistors can be utilized to realize the three input comparator 50. In the example implementation of FIG. 2, two N-channel MOS (Metal Oxide Semiconductor) transistors are connected with their sources and drains in parallel and with their gates receiving the input signals from 40 and 42. These transistors are shown as 202 and 204, respectively. The sources of transistors 202 and 204 are connected via a current source 208 to ground. The drains of transistors 202 and 204 are supplied with current through the drain of transistor 212 whose source is connected to V+. In this implementation, transistor 212 is a P-channel MOS transistor. The reference voltage is applied to the non-inverting input of the comparator formed by the gate of an N-channel MOS transistor 218 with source connected to current source 208 and drain connected to the drain of a P-channel transistor 220 which is connected at its source to the voltage supply V+. The junction of transistors 218 and 220 provides an output which can be inverted by an inverter 226 to provide output signal 52.

Those skilled in the art will note that when signals 40 and 42 are close together (e.g. within approximately 100–200 mV, depending on the transistor gain) both transistors 202 and 204 will be partially turned on with some proportional amount of current flowing through each of transistors 202 and 204. However, when one of the input signals at 40 or 42 is significantly larger (e.g. greater than about 200 mV, again depending on the transistor gain) the output at 52 is almost exclusively determined by the larger of the two input signals. The above discussion, of course, assumes that both signals at terminals 40 and 42 are in excess of the reference voltage $V_{REF}$. Thus, the input circuit arrangement of transistors 202 and 204 provide a somewhat imperfect "analog OR" function. In this "analog OR" function, if either of the signals at 40 or 42 is larger than the $V_{REF}$ at the gate of transistor 218, then the output at 52 will change state. If the signals at 40 and 42 are comparable in size, and greater than the $V_{REF}$ at the gate of transistor 218, the output at 52 will also change state. However, most of the time one signal at 40 or 42 will be dominantly larger than the other since the two signals are differentially related and will thus control the output at 52. In the case where the common mode voltage is less than the reference voltage $V_{REF}$ by more than a few hundred mV, the larger inverting input will always control. Those skilled in the art will appreciate that the detailed analysis of the three input comparator appearing in U.S. Pat. No. 5,349,304 to Ryat can be readily adapted to characterize the operation of the comparator of FIG. 2 with the simple addition of an inverter at the output of the Ryat device.

Figure 3:
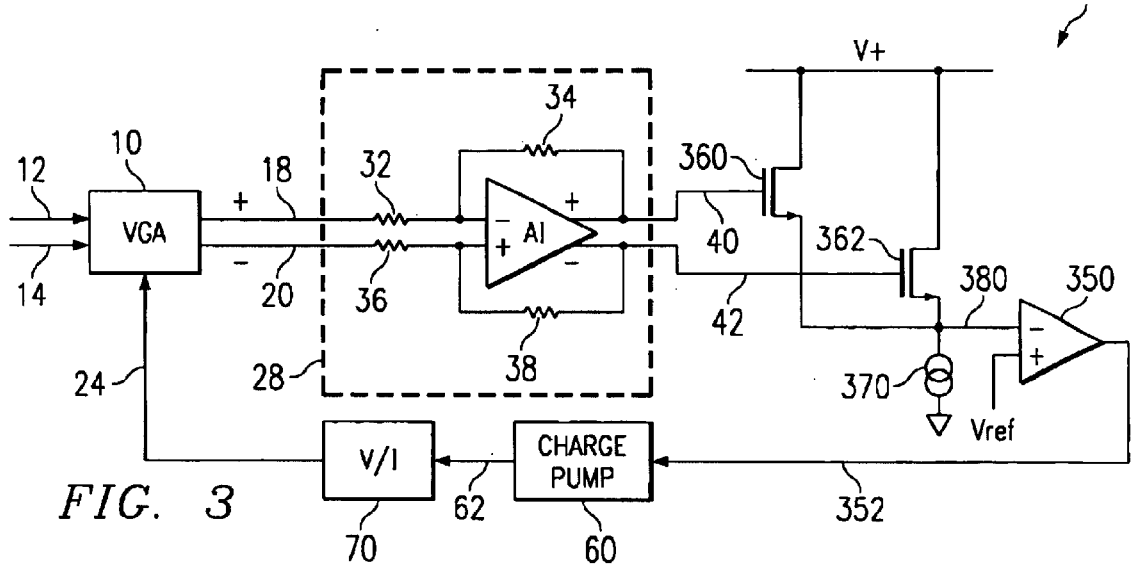
FIG. 3 is a schematic diagram of a gain regulating circuit in accordance with a second embodiment of the present invention.

Referring now to FIG. 3, a second embodiment of a gain-regulation circuit 300 for a differential amplifier is shown in which a more conventional two input comparator 350 is utilized. Like reference numbers indicate devices of similar design and function as those in FIGS. 1 and 2. In this embodiment, a $V_{REF}$ is again applied to a non-inverting input of comparator 350 with the outputs 40 and 42 of fully differential amplifier 28 being applied to a circuit that provides an "analog OR" function which operates similar to the input circuit of comparator 50. This analog OR function is implemented by a pair of transistors 360 and 362 along with a current source 370. As with the comparator of FIG. 2, the circuit arrangement 300 of FIG. 3 utilizes two N-channel MOS transistors 360 and 362 which are connected with their sources and drains connected together so that the transistors are in a parallel source follower (common drain) amplifier configuration. Both transistors 360 and 362 are connected to the supply V+ at their drains. Their common sources are connected to current source 370 to ground with the junction of the current source and the sources of transistors 360 and 362 forming the output 380 of the analog OR circuit.

Circuit 300 operates in a manner very similar to that of circuit 100 of FIG. 1. In circuit 300, the output signals at 40 and 42 are applied to the gates of transistors 360 and 362. Again, due to the differential nature of the signals at 40 and 42, the output signal 380 is most often the result of a contribution from the larger of the signals at 40 and 42. When the signals at 40 and 42 are within a few hundred mV of one another, the output 380 is produced as a result of the shared contribution of the signals 40 and 42. The actual output appearing at 380 depends somewhat upon the gains of each of transistors 360 and 362 (or 202 and 204 in circuit 50) such that the larger signal will generally almost completely override any contribution of the smaller signal. It should be remembered that the "analog OR" function produced by the circuit arrangement of transistors 360, 362 and 370 does not always produce a logic level output at 380. In fact, the signal at 380 is an analog signal which is converted to a digital signal by comparator 350 only after comparing the analog signal at 380 with the reference voltage. Once again, when this transformation from analog to digital occurs at 352, this signal is used to control charge pump 60 and thus voltage-to-current converter 70 to produce the regulating signal at 24 which controls the gain of VGA 10.

In both circuits 100 and 300, the output at 52 and 352 will generally appear as a series of pulses with the signal at 24 ultimately being dependent upon how much of the time charge pump switches within charge pump 60 are closed under control of the output of comparator 50 or 350 as described more fully in U.S. Pat. No. 5,805,022 to Bruccoleri et al.

Thus, in each of the circuit arrangements of FIG. 1 and FIG. 3, substantial size reductions over the disclosed embodiment of Bruccoleri et al can be achieved. In instances where a known asymmetry exists in an input signal, the gains of the two differential signal paths of fully differential amplifier 28 can be adjusted by selection of resistor values for resistors 32, 34, 36 and 38 to appropriately compensate. In less critical applications where accounting for symmetry is not of great importance and it is acceptable for the larger of the signals to dominantly control the gain of the VGA, the two gain paths of fully differential amplifier 28 can be established to be the same by proper resistor selection.

Referring now to FIG. 4, another compact embodiment of a circuit 400 for regulating the gain of VGA 10 is illustrated. In this embodiment, a pair of N-channel MOS transistors 402 and 404 are utilized in conjunction with an amplifier 408 and resistors 412, 414 and 416 to implement a full wave rectifier circuit in which asymmetrical gain may or may not be applied to the two differential signals, as desired. Thus, the relative outputs at 18 and 20 can be scaled by application of differing amplification if desired. Transistor 402 has its source connected to the gate of transistor 404 and transistor 404 has its source connected to the gate of transistor 402. Resistor 412 is in series with output 18 and the source of transistor 402. Resistor 414 is in series with the output 20 and the source of transistor 404. The drains of transistors 402 and 404 are connected together at the inverting input of operational amplifier 408. The non-inverting terminal of operational amplifier 408 is connected to a reference voltage (e.g. AC ground) and resistor 416 is a feedback resistor between the output and the inverting input of operational amplifier 408. Those of ordinary skill in the art will recognize that the operational amplifier 408 as shown is configured in a summing amplifier configuration. The gain of the summing amplifier can be configured to be either the same or different for each of the outputs 18 and 20 by selection of resistor values 412 and 414 to appropriately scale the signals if desired. Of course, in general, there will only be one of output signals 18 and 20 applied to the summing amplifier at any given time due to the differential nature of the signals at 18 and 20.

In operation, due to the differential nature of the output signal from the VGA 10, in general only one of transistors 402 and 404 will conduct from source to drain at any given time except when the voltage at 18 is approximately equal to the voltage at 20. When transistor 402 is conducting, the signal at output 18 passes through resistor 412 which serves as an input resistor for operational amplifier 408. Thus, the signal at terminal 18 is amplified by operational amplifier 408 with a gain approximating the ratio of resistors 416 and 412 (assuming transistor 402 is fully conductive, and resistor 412 is much larger than the ON resistance of transistor 402). Similarly, when transistor 404 is conducting from source-to-drain, the signal at output terminal 20 passes through resistor 414 which serves as an input resistor to operational amplifier 408 and the output at 20 is amplified by a factor approximated by the ratio of resistor 416 to resistor 414 (assuming transistor 404 is fully conductive and resistor 414 is much larger than the ON resistance of transistor 404). The output 420 from amplifier 408 is applied to the inverting input of comparator 350 and the remaining circuit operation is identical to that previously disclosed. Those of ordinary skill in the art will appreciate that by setting the values of resistors 412 and 414 to the same value, the signals at outputs 18 and 20 will be amplified by an equivalent amount upon reaching the output of amplifier 408 at 420. Those of ordinary skill in the art will also appreciate that signals with known asymmetry at 18 and 20 can be compensated by selecting differing resistor values for 412 and 414 to produce different gains at amplifier 408.

In this embodiment, transistors 402 and 404 behave as switches with the signal at 18 passing through transistor 402 to the amplifier 408 under the control of the signal at 20 applied to the gate of transistor 402. Similarly, the signal at 20 passes through transistor 404 to the amplifier 408 under the control of the signal at 18 applied to the gate of transistor 404.

Referring now to FIG. 5, another embodiment of the invention is illustrated wherein amplifier 408 and resistor 416 are replaced by a single resistor 506 to ground. In circuit 500 of FIG. 5, the circuit arrangement is similar to that of circuit 400 of FIG. 4 except that N-channel MOS transistors 402 and 404 are replaced by P-channel MOS transistors 502 and 504. In this embodiment, no gain greater than one is possible from outputs 18 and 20 to the input of comparator 350. The voltages can, however, be scaled by selection of resistor values. The voltage at the inverting input of comparator 350 is produced as a result of simple voltage division between either resistors 412 and 504 or resistors 414 and 504 depending on the conductive state of transistors 502 and 504. Thus, as in FIG. 4, circuit 500 of FIG. 5 can similarly accommodate asymmetrical signals with known characteristics at outputs 18 and 20.

In this embodiment, transistors 502 and 504 behave as switches with the signal at 18 passing through transistor 502 to the resistor 506 under the control of the signal at 20 applied to the gate of transistor 502. Similarly, the signal at 20 passes through transistor 504 to the resistor 506 under the control of the signal at 18 applied to the gate of transistor 504.

In a minor variation of circuits 400 and 500, the input resistors 412 and 414 can be disposed between the drains of transistors 402, 404 or 502, 504 and the inverting input of amplifier 408 or resistor 506 without departing from the invention. In both circuits 400 and 500, the summing amplifier and the voltage divider circuits serve as scaling circuits which permit the user to design the circuits to account for any known asymmetry in the signals at 18 and 20. Alternatively, resistor values can be made unequal so that the asymmetry can be adjusted out. Unequal resistor values could also be used in circuits 100 and 300.

Those of ordinary skill in the art will recognize that the embodiments illustrated in FIGS. 1–5 of the present invention variously utilize P-channel and N-channel MOS field effect transistors (MOSFETs); however complementary designs which reverse the role of P and N-channel transistors are trivial and considered to be equivalent variations of the above embodiments. Those of ordinary skill in the art will also recognize that the specific transistor circuitry disclosed can be implemented in many variations utilizing various fabrication technologies including CMOS, bipolar and FET process technologies for integrated circuits and such variations are also contemplated and considered equivalent. Those of ordinary skill in the art will also appreciate that many circuit variations can be utilized to implement embodiments the present invention. In addition, while the above embodiments have provided for correction of known asymmetries in the output of the VGA 10, the same circuits can be used to provide for desired differences in thresholds for comparison with the outputs at 18 and 20 by suitably selecting differing gains for each of the differential signal paths, whether the outputs at 18 and 20 are known to be symmetrical or asymmetrical.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A circuit which regulates gain in a differential amplifier having first and second outputs, comprising:
    a fully differential amplifier receiving the first and second outputs, said fully differential amplifier producing first and second amplified outputs;
    a comparison circuit which compares the first and second amplified outputs with a reference and produces an output signal if either the first or second amplified output exceeds the reference; and
    a processing circuit, connected to receive the output signal from the comparison circuit, to generate a regulating signal dependent upon a duration of the output signal wherein the regulating signal regulates a gain of the differential amplifier.

2. The circuit of claim 1, wherein the fully differential amplifier has a first gain applied to the first output of the fully differential amplifier and a second gain applied to the second output of the fully differential amplifier to produce amplified first and second outputs.

3. The circuit of claim 2, wherein the first and second gains are equal.

4. The circuit of claim 1, wherein the comparison circuit comprises a three input comparator having two inputs which are compared with a reference input.

5. The circuit of claim 4, wherein the two inputs are inverting inputs and the reference input is a non-inverting input.

6. The circuit of claim 4, wherein the two inputs are non-inverting inputs and the reference input is an inverting input.

7. The circuit of claim 1, wherein the processing circuit comprises:
    a charge pump receiving the output signal from the comparison circuit and producing a control voltage; and
    a voltage to current converter receiving the control voltage from the charge pump and producing a control current therefrom, the control current operating as the regulating signal.

8. The circuit of claim 1, wherein the comparison circuit comprises a comparator having a single input which is compared with a reference and further comprising an analog OR circuit receiving the first and second outputs and producing an output to the single input of the comparator.

9. The circuit of claim 8, wherein the analog OR circuit is comprised of two source followers having inputs at their respective gates and sharing a common current source at their respective sources, with the output being taken at a junction of the current source and the respective sources.

10. A circuit which regulates gain in a differential amplifier having first and second outputs, comprising:
a fully differential amplifier receiving the first and second outputs, the fully differential amplifier having a first gain applied to the first output and a second gain applied to the second output to produce first and second amplified outputs;
a comparison circuit which compares the amplified first and second amplified outputs with a reference and produces an output signal if either the first or second amplified output exceeds the reference, and wherein the comparison circuit comprises a comparator having multiple inputs which are compared with the reference; and
a processing circuit, connected to receive the output signal from the comparison circuit, to generate a regulating signal dependent upon a duration of the output signal, the processing circuit comprising:
a charge pump receiving the output signal from the comparison circuit and producing a control voltage; and
a voltage to current converter receiving the control voltage from the charge pump and producing a control current therefrom, the control current operating as the regulating signal which regulates the gain of the differential amplifier.

11. A method of regulating a gain of a variable gain differential amplifier having output signals, comprising:
amplifying the output signals to produce amplified signals;
comparing the amplified signals with a reference in a comparison circuit; and
if either amplified signal exceeds the reference, generating a regulating signal to reduce the gain of the variable gain differential amplifier.

12. The method of claim 11, wherein the amplifying is carried out in a fully differential amplifier.

13. The method of claim 12, wherein the fully differential amplifier has a first gain factor applied to the first output and a second gain factor applied to the second output.

14. The method of claim 11, wherein the comparison circuit comprises a three input comparator.

15. The method of claim 11 wherein the regulating signal has a duration depending upon the output signals.

16. The method of claim 11, wherein the amplifying is carried out in an amplifier having gain greater than 1.

17. A method of detecting a level of a differential output signal, comprising:
comparing each differential output signal with a single fixed reference signal using a single comparison circuit; and
if either output signal exceeds the reference signal, generating an output signal.

18. The method of claim 17, wherein the comparing is carried out in a three input comparator.

19. The method of claim 17, wherein the comparing is carried out in a comparison circuit comprising a comparator having a single input which is compared with a reference and an analog OR circuit receiving the differential output signals and producing an output to the single input of the comparator.

20. A circuit that regulates gain in a differential amplifier having first and second outputs, comprising:
a combiner operable to receive the first and second outputs of the differential amplifier and generate one or more combiner outputs; and
a comparison circuit that receives the one or more combiner outputs and a reference and generates an output signal operable to control the gain of the differential amplifier.

21. The circuit of 20, wherein the comparator output operates to affect a negative feedback loop to control the gain of the differential amplifier.

22. The circuit of claim 20, wherein the combiner comprises a fully differential amplifier that receives the first and second outputs and generates first and second amplified outputs;
wherein the comparison circuit compares the first and second amplified outputs with the reference and produces the output signal of the comparison circuit if either the first or second amplified output exceeds the reference; and
wherein the circuit further comprises:
a processing circuit, connected to receive the output signal from the comparison circuit, to generate a regulating signal dependent upon a duration of the output signal of the comparison circuit wherein the regulating signal regulates the gain of the differential amplifier.

23. The circuit of claim 22 wherein the processing circuit comprises:
a charge pump receiving the output signal from the comparison circuit and producing a control voltage; and
a voltage to current converter receiving the control voltage from the charge pump and producing a control current therefrom, the control current operating as the regulating signal.

24. The circuit of claim 20, wherein the combiner comprises:
a first switch coupled to the first output, the first switch being controlled by the second output;
a second switch coupled to the second output, the second switch being controlled by the first output;
a scaling circuit receiving the first and second outputs under control of the first and second switches to produce a scaled output;
wherein the comparison circuit compares the scaled output with the reference and produces the output signal if the scaled output exceeds the reference; and
wherein the circuit further comprises:
a processing circuit, connected to receive the output signal from the comparison circuit, to generate a regulating signal dependent upon a duration of the output signal that regulates the gain of the differential amplifier.

25. The circuit of claim 20, wherein the combiner comprises a fully differential amplifier receiving the first and second outputs, the fully differential amplifier having a first gain applied to the first output and a second gain applied to the second output to produce first and second amplified outputs;
wherein the comparison circuit compares the amplified first and second amplified outputs with the reference and produces the output signal if either the first or second amplified output exceeds the reference, and wherein the comparison circuit comprises a comparator having multiple inputs which are compared with the reference; and wherein the circuit further comprises:
  a processing circuit, connected to receive the output signal from the comparison circuit, to generate a regulating signal dependent upon a duration of the output signal, the processing circuit comprising:
    a charge pump receiving the output signal from the comparison circuit and producing a control voltage; and
    a voltage to current converter receiving the control voltage from the charge pump and producing a control current therefrom, the control current operating as the regulating signal which regulates the gain of the differential amplifier.

26. The method of claim 13, wherein the fully differential amplifier has a first transfer function applied to the first output and a second transfer function applied to the second output.

27. The method of claim 26, wherein the first and second transfer functions are gain factors.

* * * * *